United States Patent [19]

Sakaue et al.

[11] Patent Number: 5,750,228
[45] Date of Patent: *May 12, 1998

[54] OPTICAL INFORMATION STORAGE MEDIUM

[75] Inventors: Yoshitaka Sakaue, Nara; Eiji Ohno, Hirakata; Kazuhisa Ide, Osaka; Kenichi Nagata, Nishinomiya; Noboru Yamada, Hirakata, all of Japan

[73] Assignee: Matsushita Electric Industrial Co., Ltd., Osaka, Japan

[*] Notice: The term of this patent shall not extend beyond the expiration date of Pat. No. 5,505,835.

[21] Appl. No.: 565,992

[22] Filed: Dec. 1, 1995

Related U.S. Application Data

[63] Continuation-in-part of Ser. No. 199,550, Feb. 22, 1994, Pat. No. 5,505,835.

[30] Foreign Application Priority Data

Feb. 22, 1993 [JP] Japan ........................ 5-31591
Mar. 23, 1993 [JP] Japan ........................ 5-63671

[51] Int. Cl.⁶ ............................................ B32B 3/00
[52] U.S. Cl. ................... 428/64.1; 428/64.4; 428/64.5; 428/913; 430/270.12; 430/270.13; 430/495.1; 430/945; 369/283; 369/288
[58] Field of Search ................... 428/64.1, 64.2, 428/64.4, 64.5, 913; 430/270.12, 270.13, 495.1, 945; 369/283, 288

[56] References Cited

U.S. PATENT DOCUMENTS

| | | | |
|---|---|---|---|
| 5,063,097 | 11/1991 | Hirota et al. | 428/65 |
| 5,068,022 | 11/1991 | Garcia | 428/64.1 |
| 5,171,618 | 12/1992 | Suzuki | 428/64 |
| 5,206,114 | 4/1993 | Kobayashi | 428/64.1 |
| 5,233,599 | 8/1993 | Ohno et al. | 428/64.1 |
| 5,271,978 | 12/1993 | Vazan et al. | 428/64 |
| 5,312,664 | 5/1994 | Raychaudhuri | 428/64 |
| 5,346,740 | 9/1994 | Ohno et al. | 428/64 |

FOREIGN PATENT DOCUMENTS

| | | |
|---|---|---|
| 61-287121 | 12/1986 | Japan. |
| 4-247339 | 9/1992 | Japan. |
| 5-334924 | 12/1993 | Japan. |

OTHER PUBLICATIONS

M. Horie et al., "Analysis of Degradation Phenomena in Million Cycle Overwriting Process", *Proceedings of the 3rd Symposium on Phase Transition*, '91 Autumn, pp. 7–13.

*Primary Examiner*—Elizabeth Evans
*Attorney, Agent, or Firm*—Ratner & Prestia

[57] ABSTRACT

An optical information storage medium includes a multilayer structure formed on a substrate. The multilayer structure is formed by a sputtering process in a discharge gas and includes at least a first dielectric layer, a recording layer which shows reversible phase change between an amorphous phase and a crystal phase, and a second dielectric layer. The multilayer structure contains sufficiently small amount of the discharge gas so that a limited amount or less of voids of the discharge gas generates in the recording layer during repeated overwrite operations.

24 Claims, 10 Drawing Sheets

OPTICAL INFORMATION STORAGE MEDIUM

CROSS-REFERENCE TO RELATED APPLICATION

This application is a continuation-in-part of U.S. patent application Ser. No. 08/199,550, filed Feb. 22, 1994, now U.S. Pat. No. 5,505,835.

BACKGROUND OF THE INVENTION

1. Field of the Invention

The invention relates to an optical information storage medium and a method for fabricating the same in which information can be recorded and reproduced rapidly and at a high density by using optical means such as a laser beam. In particular, the invention relates to a phase change type optical disk and a method for fabricating the same.

2. Description of the Related Art

The technique of recording and reproducing information at a high density by using a laser beam is known in the art, and is put to practical use mainly in the form of optical disks.

Optical disks can be roughly classified into a read only type, a write-once type, and a rewritable type. The read only type optical disk is practically used as a compact disk or a laser disk. Optical disks of the write-once type and of the rewritable type are practically used as document files, data files or the like.

The rewritable type optical disk can be classified into a magneto-optical type and a phase change type.

The phase change type optical disk utilizes a phenomenon in which a state of a recording layer reversibly changes between an amorphous state and a crystal state (or between two crystal states having different structures from each other) by irradiation of a laser beam. When a laser beam irradiates, at least one of the refractive index and the extinction coefficient of the recording layer changes, whereby signals are recorded. In the portion where the state of the recording layer changes, the amplitude of light transmitted therethrough or reflected therefrom changes and as a result, the quantity of transmitted or reflected light which can reach a detection system changes. This change in quantity of the light is detected so as to reproduce the signals. Materials which show the reversible change of the state between the amorphous state and the crystal state are alloys of Te, Se, In, Sb or the like.

The phase change type optical disk is fabricated by laminating a dielectric layer, a recording layer, a reflecting layer and so on on a substrate by a vapor deposition method or a sputtering method. Compared to the vapor deposition method, the sputtering method provides better adhesion properties between the substrate and the deposited layers and higher reproducibility of thickness and composition of the deposited layers. In addition, larger and more uniform deposited layers can be obtained by sputtering. For these reasons, the phase change type optical disk is mainly fabricated by the sputtering method. Moreover, in the conventional sputtering method, cheap Ar gas is usually used as a discharge gas.

However, the phase change type optical disk fabricated by the above conventional sputtering method using Ar gas has a problem in that the number of recording/erasing cycles is limited because of deterioration phenomena caused by repeated overwrite operations. One of such deterioration phenomena is aggregation and growth of voids in the recording layer caused by repeated overwrite operations, with the result that there arise problems such as decrease of signal amplitude and increase of noise level.

It is suggested that there are the following two causes of void growth. First, Ar gas introduced into the recording layer during a forming step thereof by sputtering gradually separates and aggregates so that the Ar voids generate and grow (cf. Horie et al., Proceedings of the 3rd Symposium on Phase Transition '91 autumn, P.7). Secondly, Ar gas introduced into the dielectric layer during a forming step thereof by sputtering gradually separates from the dielectric layer by repeated overwrite operations and are introduced into recording layer so that the Ar voids generate and grow in the recording layer.

The second cause will be described in more detail as follows. During the recording/erasing processing of the signals, the temperature of the recording layer of the phase change type optical disk rises up to about 600° C. which almost is equal to the melting point of the material of the recording layer. As a result, the dielectric layer which is adjacent to the recording layer is also heated to a high temperature. This heating causes Ar gas to separate from the dielectric layer and to enter the recording layer. The Ar gas once introduced into the recording layer aggregates to generate the Ar voids in the recording layer.

The above-mentioned void growth which is caused by Ar gas being used as a discharge gas in the forming steps by sputtering and the related deterioration of performance properties of the phase change type optical disk are well-known phenomena. However, no substantial solutions for the problem are disclosed so far. Changing sputtering conditions, such as gas pressure, does not significantly improve the performance properties of the phase change type optical disk.

SUMMARY OF THE INVENTION

The method of the invention for fabricating an optical information storage medium including on a substrate, a recording layer which shows reversible phase change between an amorphous phase and a crystal phase, includes the step of forming the recording layer by sputtering in a discharge gas, the discharge gas including at least one of Xe gas and Kr gas.

In one embodiment, the discharge gas further includes Ar gas. In another embodiment, the discharge gas further includes $N_2$ gas. In a preferred embodiment, the discharge gas includes Kr gas and $N_2$ gas, a partial pressure ratio of the $N_2$ gas to a total pressure of the discharge gas being in a range from 0.25% to 10%. Alternatively, the discharge gas includes Xe gas and $N_2$ gas, a partial pressure ratio of the $N_2$ gas to a total pressure of the discharge gas being in a range from 0.25% to 5%.

In one embodiment, the recording layer has a main component selected from the group consisting of SbTe, GeSbTe, GeSbTeSe, GeSbTePd, TeGeSnAu, AgSbTe, GeTe, GaSb, InSe, InSb, InSbTe, InSbSe and InSbTeAg.

The method of the invention for fabricating an optical information storage medium including on a substrate, a first dielectric layer, a recording layer which shows reversible phase change between an amorphous phase and a crystal phase, and a second dielectric layer, includes the step of forming at least one selected layer of the first dielectric layer, the recording layer and the second dielectric layer by sputtering in a discharge gas, the discharge gas including at least one of Xe gas and Kr gas.

In one embodiment, the method further includes the step of forming a reflecting layer on the second dielectric layer.

In another embodiment, the discharge gas further includes Ar gas. In still another embodiment, the discharge gas further includes $N_2$ gas. In a preferred embodiment, a partial pressure ratio of the $N_2$ gas to a total pressure of the discharge gas being in a range from 0.1% to 10%.

In one embodiment, the recording layer has a main component selected from the group consisting of SbTe, GeSbTe, GeSbTeSe, GeSbTePd, TeGeSnAu, AgSbTe, GeTe, GaSb, InSe, InSb, InSbTe, InSbSe and InSbTeAg.

In another embodiment, the first dielectric layer and the second dielectric layer are made of at least one material selected from the group consisting of $SiO_2$, SiO, $TiO_2$, MgO, $Ta_2O_5$, $Al_2O_3$, $GeO_2$, $Si_3N_4$, BN, AlN, SiC, ZnS, ZnSe, ZnTe and PbS.

In still another embodiment, the first dielectric layer, the recording layer and the second dielectric layer except the at least one selected layer are formed by sputtering in Ar gas.

The optical information storage medium of the invention includes on a substrate, a first dielectric layer, a recording layer which shows reversible phase change between an amorphous phase and a crystal phase, and a second dielectric layer, wherein at least one of the first dielectric layer, the recording layer and the second dielectric layer does not contain Ar.

Alternatively, the optical information storage medium of the invention includes a multilayer structure formed on a substrate. The multilayer structure is formed by a sputtering process in a discharge gas and includes at least a first dielectric layer, a recording layer which shows reversible phase change between an amorphous phase and a crystal phase, and a second dielectric layer. The multilayer structure contains sufficiently small amount of the discharge gas so that a limited amount or less of voids of the discharge gas generates in the recording layer during repeated overwrite operations. Preferably, the limited amount of voids of the discharge gas generated in the recording layer corresponds to an amount which provides a decrease of 3 dB in a Carrier-to-Noise ratio in the repeated overwriting operations.

Still alternatively, the optical information storage medium of the invention includes a multilayer structure formed on a substrate. The multilayer structure includes at least a first dielectric layer, a recording layer which shows reversible phase change between an amorphous phase and a crystal phase, and a second dielectric layer. At least one of the first dielectric layer, the recording layer and the second dielectric layer is formed by a sputtering process in a discharge gas, the discharge gas including at least one of Kr gas and Xe gas. Preferably, the multilayer structure contains sufficiently small amount of the discharge gas so that a limited amount or less of voids of the discharge gas generates in the recording layer during repeated overwrite operations. More preferably, the limited amount of voids of the discharge gas generated in the recording layer corresponds to an amount which provides a decrease of 3 dB in a Carrier-to-Noise ratio in the repeated overwriting operations.

In one embodiment, wherein at least one of the first dielectric layer, the recording layer and the second dielectric layer contains no Ar used as the discharge gas.

In another embodiment, wherein the amount of the discharge gas contained in the recording layer is about 0.3 at % or less.

In still another embodiment, wherein the total amount of the discharge gas contained in the first dielectric layer and the second dielectric layer is about 0.2 at % or less.

In still another embodiment, the recording layer is made of chalcogen alloy. Preferably, the recording layer has a main component selected from the group consisting of SbTe, GeSbTe, GeSbTeSe, GeSbTePd, TeGeSnAu, AgSbTe, GeTe, GaSb, InSe, InSb, InSbTe, InSbSe and InSbTeAg. In particular, the recording layer has a main component of GeSbTe.

In still another embodiment, the first dielectric layer and the second dielectric layer are made of at least one material selected from the group consisting of $SiO_2$, SiO, $TiO_2$, MgO, $Ta_2O_5$, $Al_2O_3$, $GeO_2$, $Si_3N_4$, BN, AlN, SiC, ZnS, ZnSe, ZnTe and PbS. Preferably, the first dielectric layer and the second dielectric layer are made of a mixture of $SiO_2$ and ZnS.

In still another embodiment, the optical information storage medium further includes a reflecting layer on the second dielectric layer.

According to the above mentioned features of the present invention, during the forming steps of the recording layer and the dielectric layer by sputtering, introduction of a discharge gas into each layer can be restrained to a sufficiently small level.

Thus, the invention described herein makes possible the advantages of (1) providing a method for fabricating an optical information storage medium wherein the aggregation and growth of voids in the phase change type recording layer, which is caused by repeated overwrite operations and brings deterioration of performance properties of the optical information storage medium such as decrease of signal amplitude and increase of noise level, can be restrained, and (2) providing an optical information storage medium having high reliability and long life in which no voids generate nor grow in the phase change type recording layer even when the repeated overwrite operations are conducted.

These and other advantages of the present invention will become apparent to those skilled in the art upon reading and understanding the following detailed description with reference to the accompanying figures.

DESCRIPTION OF THE PREFERRED EMBODIMENTS

A phenomenon called "the deterioration of cycle life characteristics" or simply "the cycle deterioration" is well-known in an optical information storage medium which has a phase change type recording layer (here, called a phase change type optical disk). In the phenomenon, the record/ erasure properties are impaired by repeated overwrite operations of about 100 cycles or more, and the cycle life characteristics of the phase change type optical disk are deteriorated.

As mechanisms of the cycle deterioration, the following have been reported: (1) a substrate or a protecting layer of the optical disk is thermally damaged because of repeated heating/cooling steps during the record/erasure process; (2) a material of the recording layer is moved along a guide groove elongating in the rotational direction of the disk by the pulsation of the protecting layer owing to the repeated heating/cooling steps; and (3) Ar voids generate and grow in the recording layer because Ar gas used as a discharge gas in the fabricating process of the optical disk by sputtering is introduced into the recording layer and a dielectric layer.

Among the above deterioration mechanisms, the inventors examined the Ar void generation in the recording layer, and conducted studies so as to establish a fabricating method which can prevent such a void generation and growth in the recording layer of the phase change type optical disk.

As a first step of the study, the optical disks were fabricated under various sputtering conditions so as to understand the influence of the sputtering conditions on the deterioration phenomena. For example, Ar gas pressure during sputtering was changed. However, the cycle life characteristics did not significantly improve. In the next step, the recording layer and the dielectric layer were formed by sputtering in an atmosphere of other rare gases (Kr, Xe) instead of Ar, with the result that the cycle life characteristics were found to improve greatly.

Hereinafter, the invention will be described with reference to the figures.

Figure 1:
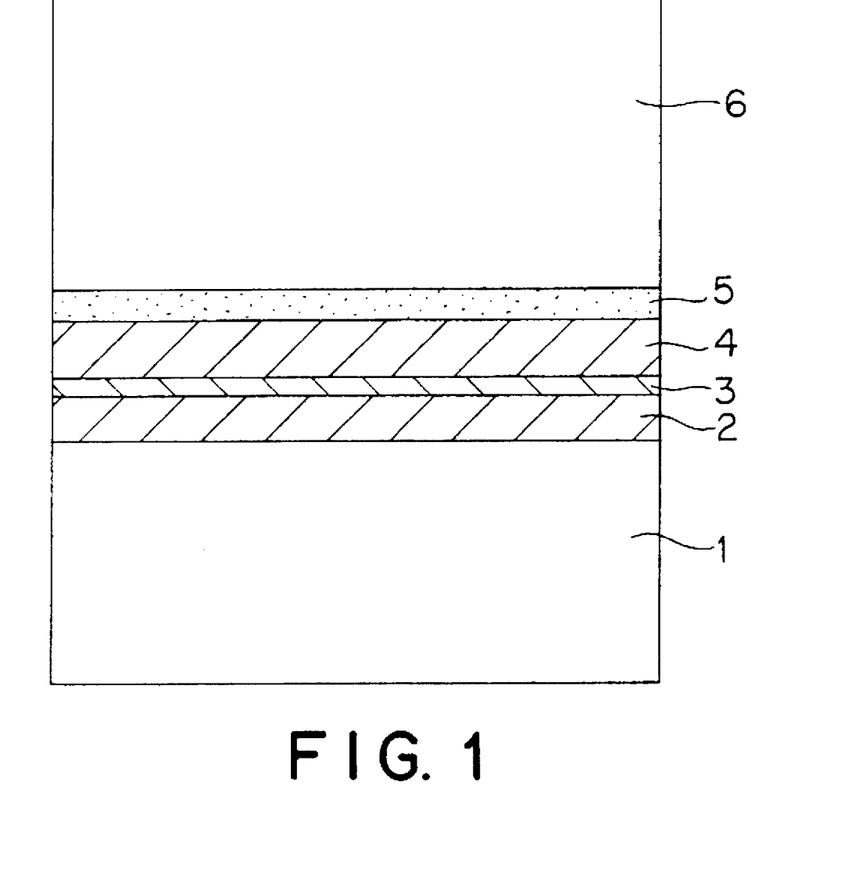
FIG. 1 is a view showing the configuration of a phase change type optical disk in accordance with the invention.

A structure of the phase change type optical disk of the invention is shown in FIG. 1. On a substrate 1, a first dielectric layer 2, a recording layer 3, a second dielectric layer 4 and a reflecting layer 5 are formed in sequence by sputtering. Furthermore, a transparent protecting layer 6 is formed on the reflecting layer 5 to firmly adhere thereto. Another reflecting layer (not shown) may be disposed between the substrate 1 and the first dielectric layer 2. Alternatively, the phase change type optical disk does not have to necessarily have the reflecting layer 5 nor the protecting layer 6. A laser beam for conducting the recording, reproducing and erasing operations is irradiated from the side of the substrate 1.

As a material of the substrate 1, glass, quartz, polycarbonate or polymethyl methacrylate may be used. The substrate 1 may be a flat plate or a plate having groove-like unevenness for tracking guides.

The protecting layer 6 may be formed by applying a resin dissolved in a solvent to the optical disk and drying it, or by attaching a resin plate to the optical disk with an adhesive.

As a material of the recording layer 3, chalcogen alloys are commonly used in which the principal component is Te, Se, Sb, In, Ge or the like. The chalcogen alloys show reversible phase change between an amorphous state and a crystal state. Examples of useful alloys include SbTe, GeSbTe, GeSbTeSe, GeSbTePd, TeGeSnAu, AgSbTe, GeTe, GaSb, InSe, InSb, InSbTe, InSbSe and InSbTeAg. Among the above alloys, GeSbTe alloy is preferably used.

As the first and the second dielectric layers 2 and 4, $SiO_2$, SiO, $TiO_2$, MgO, $Ta_2O_5$, $Al_2O_3$, $GeO_2$, $Si_3N_4$, BN, AlN, SiC, ZnS, ZnSe, ZnTe, PbS and their mixtures can be used. Preferably a mixture of $SiO_2$ and ZnS is used.

As the reflecting layer 5, materials in which the principal component is a metal such as Au, Al, Cu, Cr, Ni, Ti and their mixtures can be used. Alternatively, a dielectric multilayer film or the like which has a large reflectivity for a given wavelength may be used.

The most important feature of the invention is that a rare gas (Kr, Xe) having a greater atomic weight than Ar is used as a discharge gas in the forming steps of the recording layer 3 or the first and the second dielectric layers 2 and 4 so as to prevent the void generation in the layers and to improve the cycle life characteristics of the phase change type optical disk. Alternatively, an Ar-added Kr gas or an Ar-added Xe gas can be used to attain the same effect. When $N_2$ is further additionally mixed with these discharge gases, the cycle life characteristics can further improve.

The effect of improving the cycle life characteristics according to the invention is particularly remarkable when the recording layer 3 is made of GeSbTe alloy.

Hereinafter, the invention will be described in more detail by illustrating specific embodiments.

EXAMPLE 1

A first embodiment of the invention is described hereinafter. In this embodiment, the phase change type optical disks in which the recording layer 3 is made of a ternary alloy of GeSbTe were used. Different discharge gases were used in a forming step of the recording layer 3, and the consequent change in the cycle life characteristics of the optical disks were studied.

Figure 2:
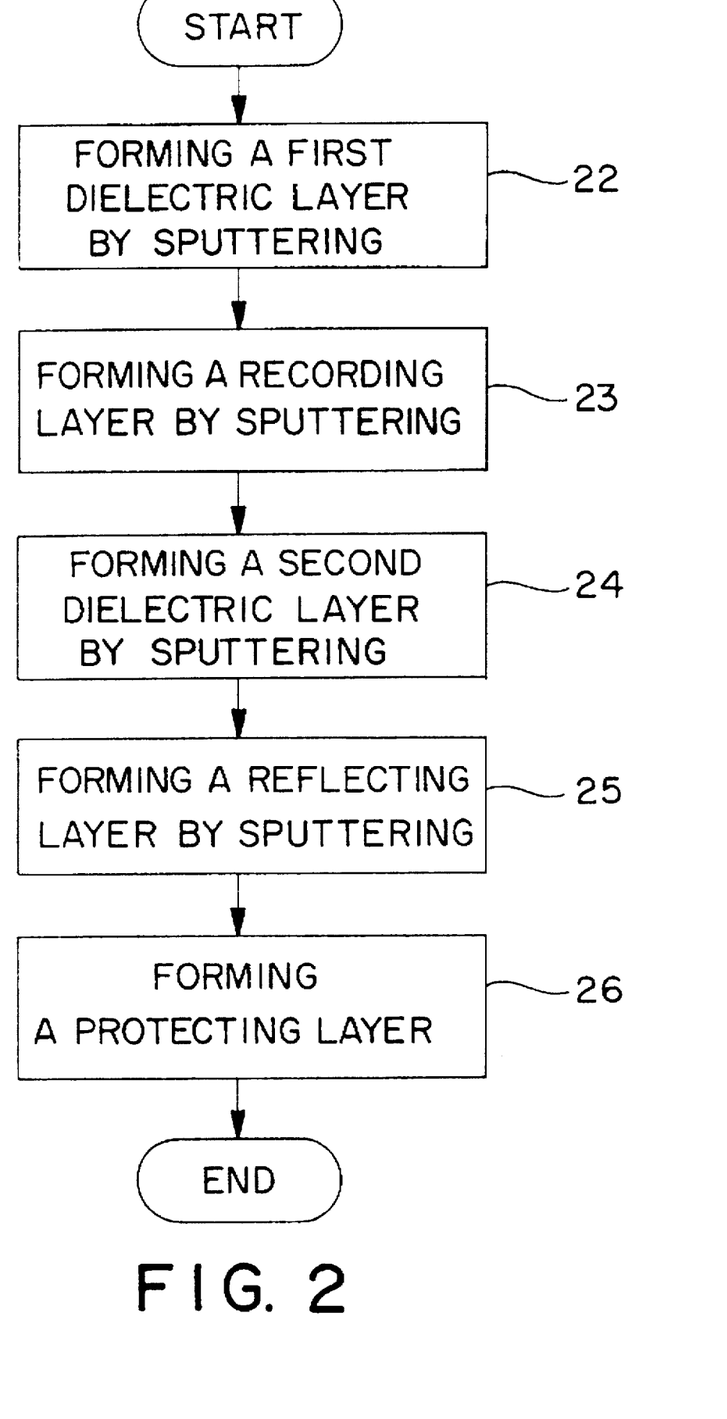
FIG. 2 is a flowchart showing the fabricating steps of the phase change type optical disk in accordance with the invention.

First, a method for fabricating the phase change type optical disk is described. The flowchart which shows the fabrication steps is shown in FIG. 2.

As the substrate 1, a polycarbonate substrate of a diameter of 130 mm having tracks for recording signals is used. First, as a forming step 22 of the first dielectric layer 2, a $ZnS-SiO_2$ mixture layer of a thickness of 1,300 angstroms was formed on the substrate 1 by an RF sputtering method with a sputtering power of 200 W. Then, as a forming step 23 of the recording layer 3, a $Ge_{22}Sb_{22}Te_{56}$ layer of a thickness of 250 angstroms was formed by a DC sputtering method with a sputtering power of 50 W. In succession, as a forming step 24 of the second dielectric layer 4, a $ZnS-SiO_2$ mixture layer of a thickness of 200 angstroms was formed by the RF sputtering method with a sputtering power of 200 W, similarly in the forming step 22 of the first dielectric layer 2. Further, as a forming step 25 of the reflecting layer 5, an Al layer of a thickness of 1,500 angstroms was formed by the DC sputtering method with a sputtering power of 400 W. Finally, as a forming step 26 of the protecting layer 6, the protecting layer 6 made of polycarbonate was formed on the reflecting layer 5 in a manner previously mentioned. In the forming steps of each layer by sputtering, the temperature of the substrate was not set to be a specific value.

As described above, in the sputtering process of this embodiment, Ar gas was used as the discharge gas in the forming steps 22 and 24 of the first and the second dielectric layers 2 and 4 by sputtering and in the forming step 25 of the reflecting layer 5 by sputtering. In contrast, in the forming step 23 of the recording layer 3 by sputtering, kind and pressure of the discharge gas were changed in eight ways as follows, and the layer formation was conducted under each condition (the numeral in each parentheses indicates the gas pressure of each condition): (1) Ar (2 mTorr); (2) Ar (5 mTorr); (3) Kr (2 mTorr); (4) Kr (5 mTorr); (5) Xe (2 mTorr); (6) Xe (5 mTorr); (7) a mixture gas of Ar (1 mTorr) and Kr (1 mTorr); and (8) a mixture gas of Ar (1 mTorr) and Xe (1 mTorr).

The forming conditions in the forming steps 22 and 24–26 of the first and the second dielectric layers 2 and 4, the reflecting layer 5 and the protecting layer 6, and the materials of each layer were identical with each other.

The thus fabricated phase change type optical disks were evaluated in the following manner. Using an optical head of a recording apparatus used for recording/erasing operations which has an objective lens with NA number of 0.55, a line velocity of 10 m/sec, a recording power of 20 mW and a bias power (erasing power) of 10 mW, signals of 5 MHz and 3 MHz were alternately recorded by a 1-beam overwriting method. A laser beam of a wavelength of 780 nm was used in the above operations. The repetition number at which the C/N ratio (Carrier-to-Noise ratio) of the reproduced signal of 5 MHz decreased from the initial value by 3 dB was determined as the cycle life.

The 1-beam overwriting method mentioned above is explained as follows. In this method, the power of the laser beam is modulated by a recording signal between a recording level and an erasing level. The thus modulated laser beam irradiates on the signal track to record new signals while erasing the previously recorded signals on the signal track. A region irradiated by the laser beam with the recording level melts irrespective of the original state of the region, i.e. whether in an amorphous state or in a crystal state. Then, the region is cooled to become amorphous. On the other hand, a region irradiated by the laser beam with the erasing level is heated to a temperature higher than the crystallization temperature. The region is crystallized irrespective of the initial state of the region. As a result, the new signals are overwritten.

Figure 3:
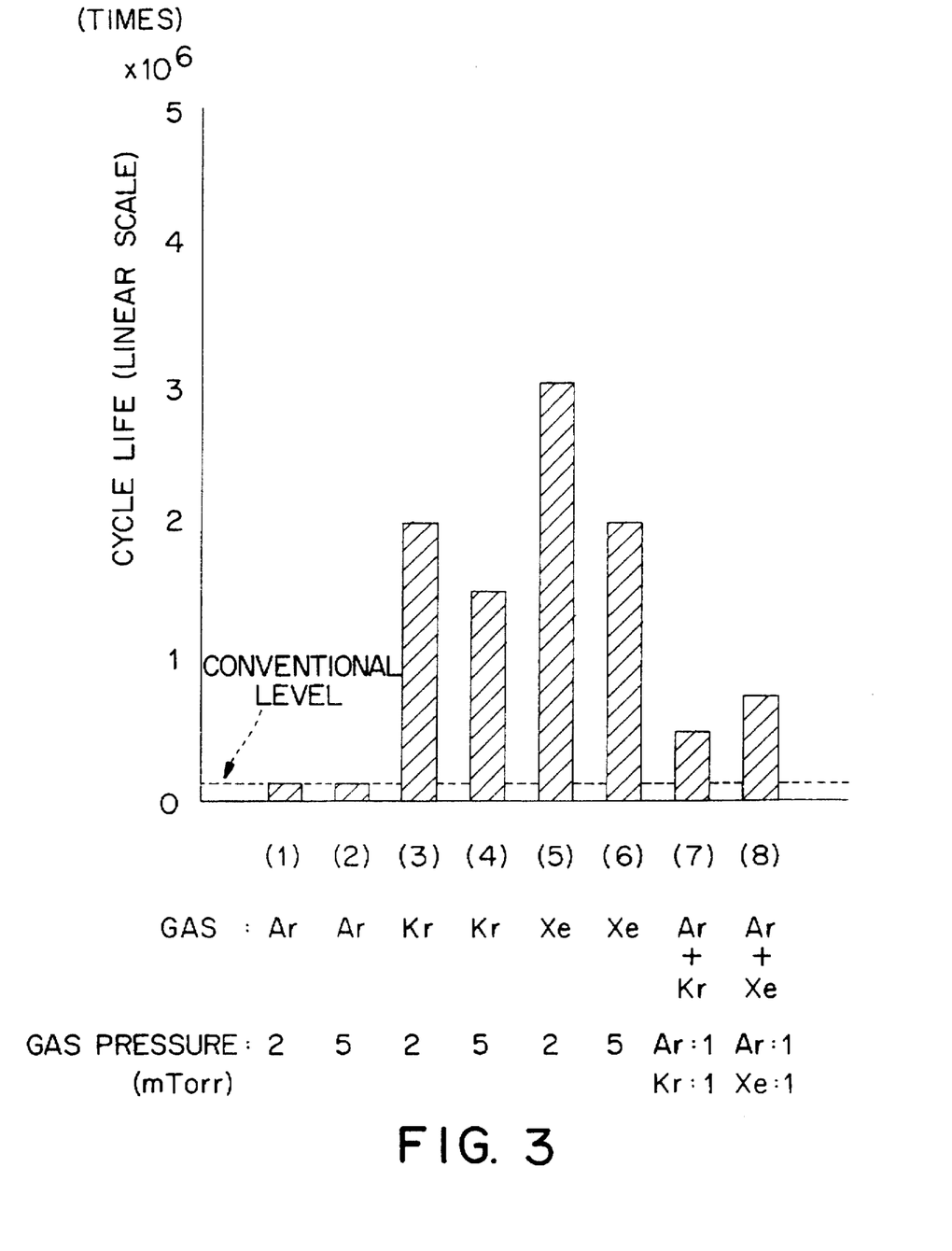
FIG. 3 shows cycle life characteristics of the phase change type optical disks in a first embodiment of the invention.

FIG. 3 shows the relationship between the kind and pressure of the discharge gas in the forming step 23 of the recording layer 3 by sputtering and the cycle life characteristics of the phase change type optical disks fabricated in this embodiment. The vertical coordinate of FIG. 3 is in a linear scale.

As shown in FIG. 3, the conventional phase change optical disks fabricated by using Ar gas as the discharge gas in the forming step 23 of the recording layer 3 by sputtering have a cycle life of $1 \times 10^5$ times irrespective of the value of gas pressure. On the other hand, replacing Ar with Kr or Xe makes the cycle life increase ten times or more. Also, it can be seen in FIG. 3 that the cycle life can improve five to seven times when a mixture gas of Ar and Kr or that of Ar and Xe is used as the discharge gas, as compared with those obtained when Ar is singly used.

Figure 4:
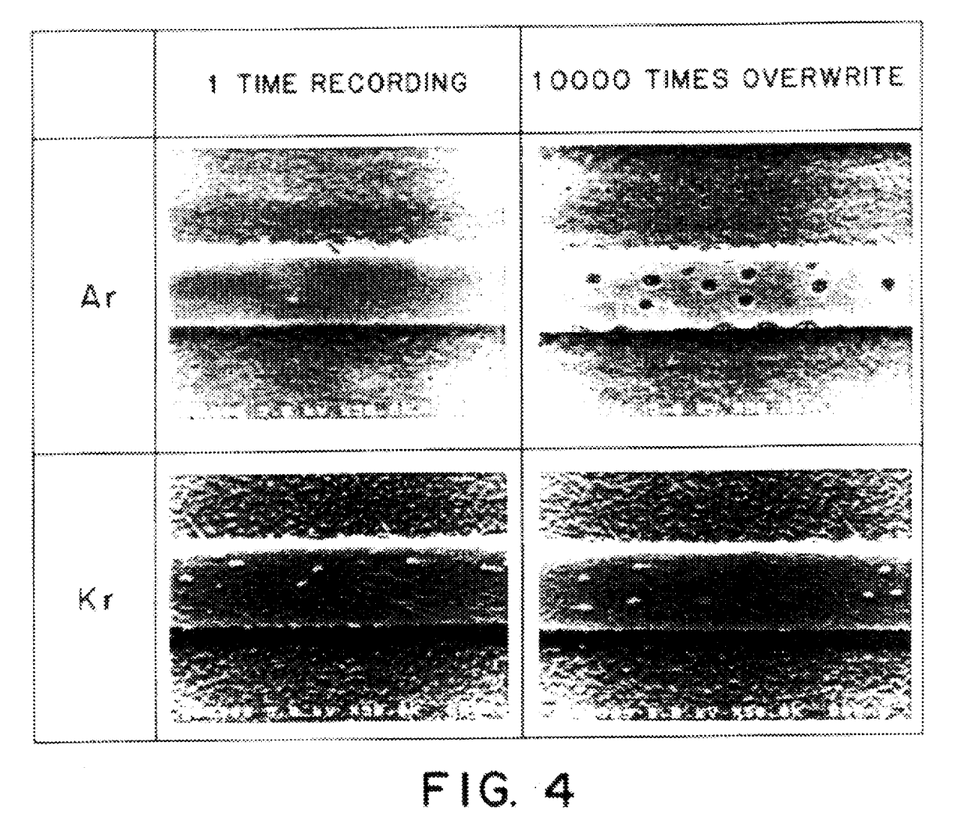
FIG. 4 shows scanning electron microscope (SEM) photos of a surface of a recording layer after repeated overwrite operations in the phase change type optical disks fabricated in the first embodiment of the invention.

FIG. 4 shows scanning electron microscope (SEM) photos of the surface of the recording layer 3 after 1 record operation and 10,000 overwrite operations. A phase change type optical disk underwent 1 record operation and then the second dielectric layer 4, the reflecting layer 5 and the protecting layer 6 were removed away so as to expose the surface of the recording layer 3. Another optical disk underwent 10,000 overwrite operations and then the same procedure was done.

The photos in the upper row show the surface of the recording layer 3 formed by using Ar gas with a pressure of 2 mTorr as the discharge gas (a sample in above (1)). The photos in the lower row show the surface of the recording layer 3 formed by using Kr gas with a pressure of 2 mTorr as the discharge gas (a sample in above (3)). For each of the forming conditions, a photo obtained after 1 record operation and that obtained after 10,000 overwrite operations are respectively shown.

When optical disks have undergone 1 record operation, voids are not observed on the surface of the recording layer 3 in both cases where the recording layer 3 was formed by using Ar and by using Kr. In contrast, after 10,000 overwrite operations, voids exist on the surface of the recording layer 3 which was formed by using Ar, while no voids exist on the surface of the recording layer 3 which was formed by using Kr. Further, although the SEM photos are not shown in FIG. 4, no voids were observed on the surface of the recording layer 3 formed by using Xe, similarly as the samples formed by using Kr.

The improvement of the cycle life characteristics by changing the discharge gas from Ar to Kr or Xe is believed to be caused for the following reason. Since the mass of Kr or Xe is greater than that of Ar, only a small quantity of Kr or Xe is introduced into the recording layer 3 during the forming step 23 of the recording layer 3 by sputtering. As a result, few voids are generated and grown by the repeated overwrite operations.

In order to confirm this consideration, the quantity of the discharge gas existing in the recording layer was measured in the following manner. Samples in which a GeSbTe layer was formed on a Si substrate by the DC sputtering with a sputtering power of 50 W were provided. The amount of discharge gas in the GeSbTe layer (which corresponds to the recording layer 3 in this embodiment) was measured by the Rutherford Back Scattering (RBS) method. The temperature of the substrate was not set to be a specific value in this case.

The experimental results show that when Ar gas with a pressure of 2 mTorr was used as the discharge gas, the quantity of Ar in the GeSbTe layer was 0.60 at %. This means that Ar gas used as the discharge gas is surely introduced into the recording layer 3. On the other hand, the quantity of Kr in the GeSbTe layer formed by using Kr gas with a pressure of 2 mTorr was 0.10 at % or less (below the detection limit). This result means that Kr as the discharge gas is not introduced into the recording layer 3 in appreciable amounts, thus supporting the above-mentioned consideration.

EXAMPLE 2

A second embodiment of the invention will be described below. In this embodiment, the phase change type optical disks were fabricated by using a mixture gas of Kr and $N_2$ and that of Xe and $N_2$ as the discharge gas in the forming step 23 of the recording layer 3 by sputtering.

To explain in more detail, the main component of the discharge gas in the forming step 23 of the recording layer 3 was Kr or Xe, and the quantity of $N_2$ to be mixed therewith was changed. The total pressure of the discharge gas during the forming step was kept at 2 mTorr, and the flow rate of Kr or Xe was changed depending on the quantity of $N_2$ gas. In both cases of Kr and Xe, the partial pressure of $N_2$ was set to be 0, 0.005, 0.05, 0.1 and 0.2 mTorr. These values respectively corresponds to 0, 0.25, 2.5, 5 and 10% of the partial pressure ratio of $N_2$ to the total pressure. The partial pressure of 0 mTorr of $N_2$ means that no $N_2$ was mixed and Kr or Xe was used singly.

Comparing this embodiment and the first embodiment, only the kind and pressure of the discharge gas in the forming step 23 of the recording layer 3 are different. Other fabricating conditions, the structure of the phase change type optical disks and the composition of materials of each layer are identical with each other.

The phase change type optical disks thus fabricated were evaluated in the same manner as in the first embodiment, and the cycle life of each disk was measured.

Figure 5:
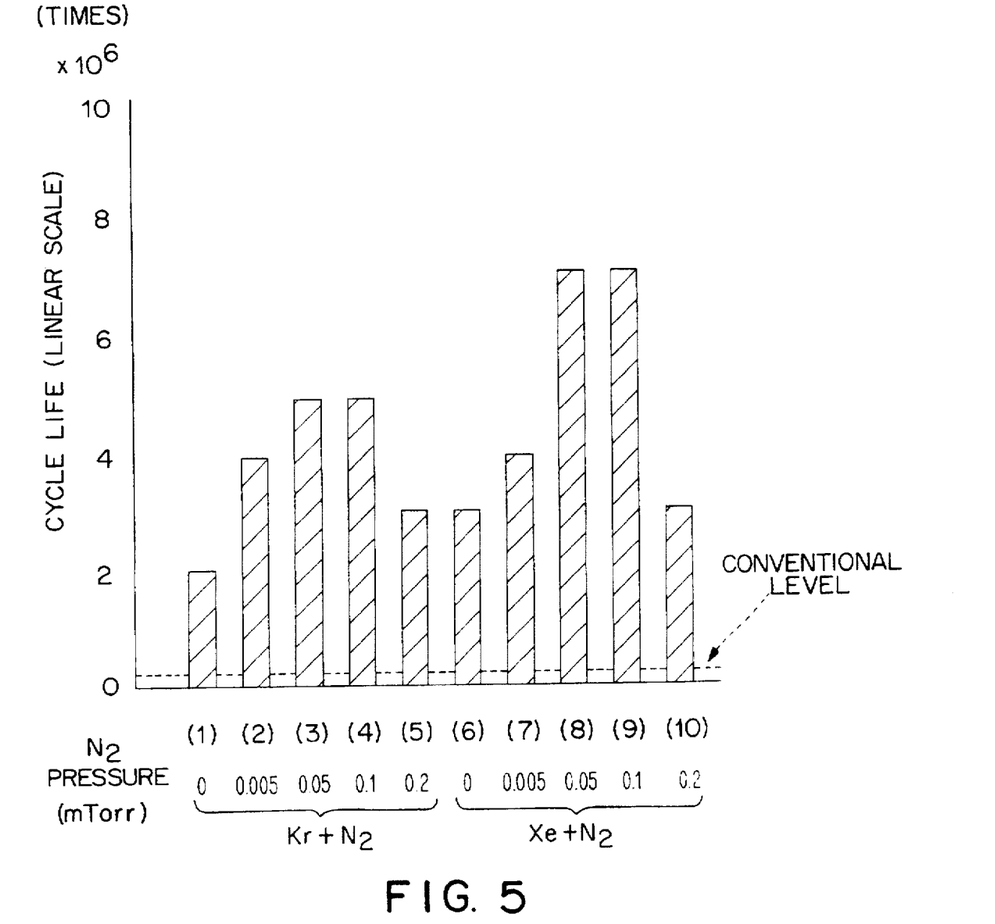
FIG. 5 shows cycle life characteristics of the phase change type optical disks in a second embodiment of the invention.

FIG. 5 shows the relationship between the partial pressure of $N_2$ in the discharge gas used in the forming step 23 of the recording layer 3 and the cycle life characteristics of the phase change type optical disks fabricated in this embodiment. The vertical coordinate of FIG. 5 is in a linear scale. The broken line in FIG. 5 indicates the conventional level of the cycle life obtained by fabricating the phase change type optical disk with the conventional technique.

As shown in FIG. 5, by using a mixture gas of Kr and $N_2$ with a partial pressure of $N_2$ in a range from 0.005 to 0.2 mTorr (with a total pressure of 2 mTorr) as the discharge gas in the forming step 23 of the recording layer 3 by sputtering, the cycle life can improve, as compared with the case where Kr gas is used singly without mixing $N_2$. Preferably, the partial pressure of $N_2$ is set to be in a range from 0.05 to 0.1 mTorr (with a total pressure of 2 mTorr) which corresponds to a partial pressure ratio of 2.5 to 5%, because the cycle life improves significantly within this range.

On the other hand, when a mixture gas of Xe and $N_2$ was used as the discharge gas in the forming step 23 of the recording layer 3 by sputtering, the cycle life improved when the partial pressure of $N_2$ was in a range from 0.005 to 0.1 mTorr (with a total pressure of 2 mTorr), as compared with the case where Xe gas was used singly without mixing $N_2$. Preferably, the partial pressure of $N_2$ is set to be in a range from 0.05 to 0.1 mTorr (with a total pressure of 2 mTorr) which corresponds to a partial pressure ratio of 2.5 to 5%, because the cycle life improves significantly within this range.

It is thought that further improvement of the cycle life characteristics obtained by mixing a small amount of $N_2$ gas into Xe or Kr is caused by, for example, the phenomenon that a chemical compound of $N_2$ and the material of the recording layer 3 is generated in the recording layer 3 to suppress the movement of the material of the recording layer 3 during repeated overwrite operations.

In this embodiment, even when the pressure of the discharge gas in the sputtering process changes, the cycle life characteristics are improved as compared with those obtained in the case where Kr or Xe are singly used, as far as the partial pressure of $N_2$ is in the above-mentioned range. In addition, it is confirmed that the cycle life characteristics similarly improve when $N_2$ is mixed with a mixture gas of Xe and Kr, or that of Kr, Xe and Ar.

EXAMPLE 3

A third embodiment of the invention is described hereinafter. In this embodiment, the phase change type optical disks in which the recording layer 3 is made of a ternary alloy of GeSbTe were used. Different discharge gases were used in forming steps 22 and 24 of the first and the second dielectric layers 2 and 4, and the consequent change of the cycle life characteristics of the optical disks were studied.

In this embodiment, Ar gas was used as the discharge gas in the forming step 23 of the recording layer 3, $Ge_{22}Sb_{22}Te_{56}$, by sputtering and in the forming step 25 of the reflecting layer 5, Al, by sputtering. In contrast, in the forming steps 22 and 24 of the first and the second dielectric layers 2 and 4, a mixture of $SiO_2$-ZnS, by sputtering, kind and pressure of the discharge gas were changed in eight ways as follows, and the layer formation was conducted under each condition (the numeral in each parentheses indicates the gas pressure of each condition): (1) Ar (2 mTorr); (2) Ar (5 mTorr); (3) Kr (2 mTorr); (4) Kr (5 mTorr); (5) Xe (2 mTorr); (6) Xe (5 mTorr); (7) a mixture gas of Ar (1 mTorr) and Kr (1 mTorr); and (8) a mixture gas of Ar (1 mTorr) and Xe (1 mTorr).

Other fabricating conditions, the structure of the phase change type optical disks, and the composition of materials of each layer are identical with each other.

The phase change type optical disks thus fabricated were evaluated in the same manner as in the first embodiment, and the cycle life of each disk was measured.

Figure 6:
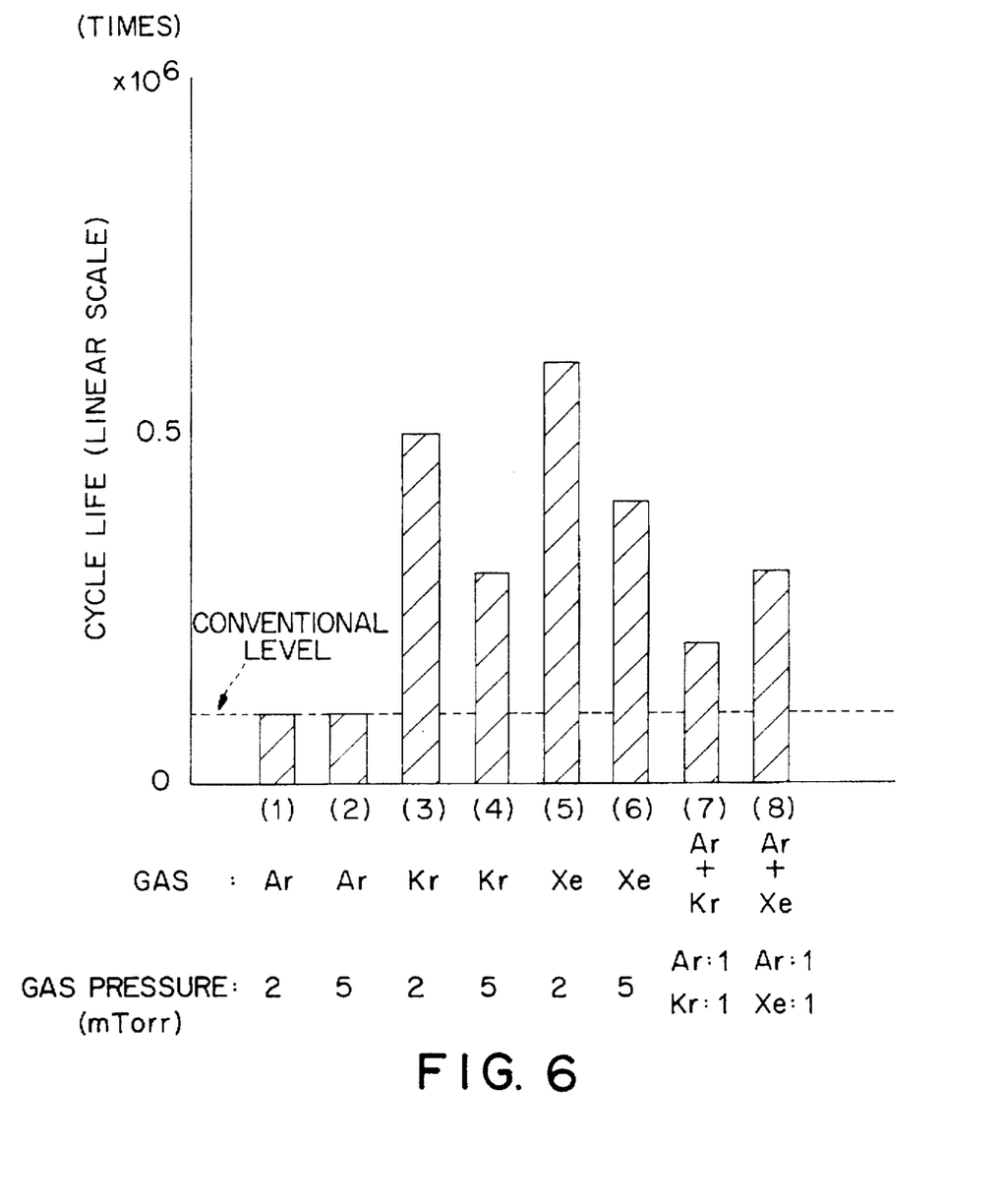
FIG. 6 shows cycle life characteristics of the phase change type optical disks in a third embodiment of the invention.

FIG. 6 shows the relationship between the kind and pressure of the discharge gas in the forming steps 22 and 24 of the first and the second dielectric layers 2 and 4 by sputtering and the cycle life characteristics of the phase change type optical disks fabricated in this embodiment. The vertical coordinate of FIG. 6 is in a linear scale. The broken line in FIG. 6 indicates the conventional level of the cycle life obtained by fabricating the phase change type optical disk with the conventional technique.

As shown in FIG. 6, replacing Ar gas with Kr or Xe makes the cycle life increase three to six times, as compared with the conventional level. Also, it can be seen in FIG. 6 that the cycle life can improve when a mixture gas of Ar and Kr or that of Ar and Xe is used as the discharge gas, as compared with those obtained when Ar is singly used.

The improvement of the cycle life characteristics by changing the discharge gas from Ar to Kr or Xe in the forming steps 22 and 24 of the first and the second dielectric layers 2 and 4 by sputtering is believed to be caused for the following reason. Since the mass of Kr or Xe is greater than that of Ar, only a small amount of Kr or Xe is introduced into the first and the second dielectric layers 2 and 4 during the forming steps thereof by sputtering. As a result, the amount of the discharge gas which moves from the first and the second dielectric layers 2 and 4 into the recording layer 3 decreases and the voids generated in the recording layer 3 by repeated overwrite operations are reduced in number.

In order to confirm this consideration, the quantity of the discharge gas existing in the dielectric layer was measured in the following manner. Samples in which a $ZnS-SiO_2$ mixture layer was formed on a Si substrate by the RF sputtering method with a sputtering power of 200 W were provided. The amount of discharge gas in the $ZnS-SiO_2$ mixture layer (which corresponds to the first and the second dielectric layers 2 and 4 in this embodiment) was measured by the Rutherford Back Scattering (RBS) method. The temperature of the substrate was not set to be a specific value in this case.

The experimental results show that when Ar gas with a pressure of 2 mTorr was used as the discharge gas, the quantity of Ar in the $ZnS-SiO_2$ mixture layer was 0.58 at %. This means that Ar gas used as the discharge gas is surely introduced into the dielectric layer. On the other hand, the quantity of Kr in the $ZnS-SiO_2$ mixture layer formed by using Kr gas with a pressure of 2 mTorr was 0.20 at %. This result means that the introduction of the discharge gas into the dielectric layer can be suppressed by replacing Ar with Kr, thus supporting the above-mentioned consideration.

In the above description, the phase change type optical disks have the reflecting layer 5 on the second dielectric layer 4. However, the same improvement of the cycle life characteristics as explained can be attained without the reflecting layer 5.

EXAMPLE 4

A fourth embodiment of the invention will be described below. In this embodiment, the phase change type optical disks were fabricated by using a mixture gas of Kr and $N_2$ and that of Xe and $N_2$ as the discharge gas in the forming steps 22 and 24 of the first and the second dielectric layers 2 and 4 by sputtering.

To explain in more detail, the main component of the discharge gas in the forming steps 22 and 24 of the first and the second dielectric layers 2 and 4 was Kr or Xe, and the quantity of $N_2$ to be mixed therewith was changed. The total pressure of the discharge gas during the forming steps was kept to be 2 mTorr, and the flow rate of Kr or Xe was changed depending on the quantity of $N_2$ gas. In both cases of Kr and Xe, the partial pressure of $N_2$ was set to be 0, 0.002, 0.05, 0.1 and 0.2 mTorr. These values respectively correspond to 0, 0.1, 2.5, 5 and 10% of the partial pressure ratio of $N_2$ to the total pressure. A partial pressure of 0 mTorr of $N_2$ means that no $N_2$ was mixed and Kr or Xe was used singly.

Between this embodiment and the third embodiment, only the kind and pressure of the discharge gases in the forming steps 22 and 24 of the first and the second dielectric layers 2 and 4 are different. Other fabricating conditions, the structure of the phase change type optical disks, and the composition of materials of each layer are identical with each other.

The phase change type optical disks thus fabricated were evaluated in the same manner as in the first embodiment, and the cycle life of each disk was measured.

Figure 7:
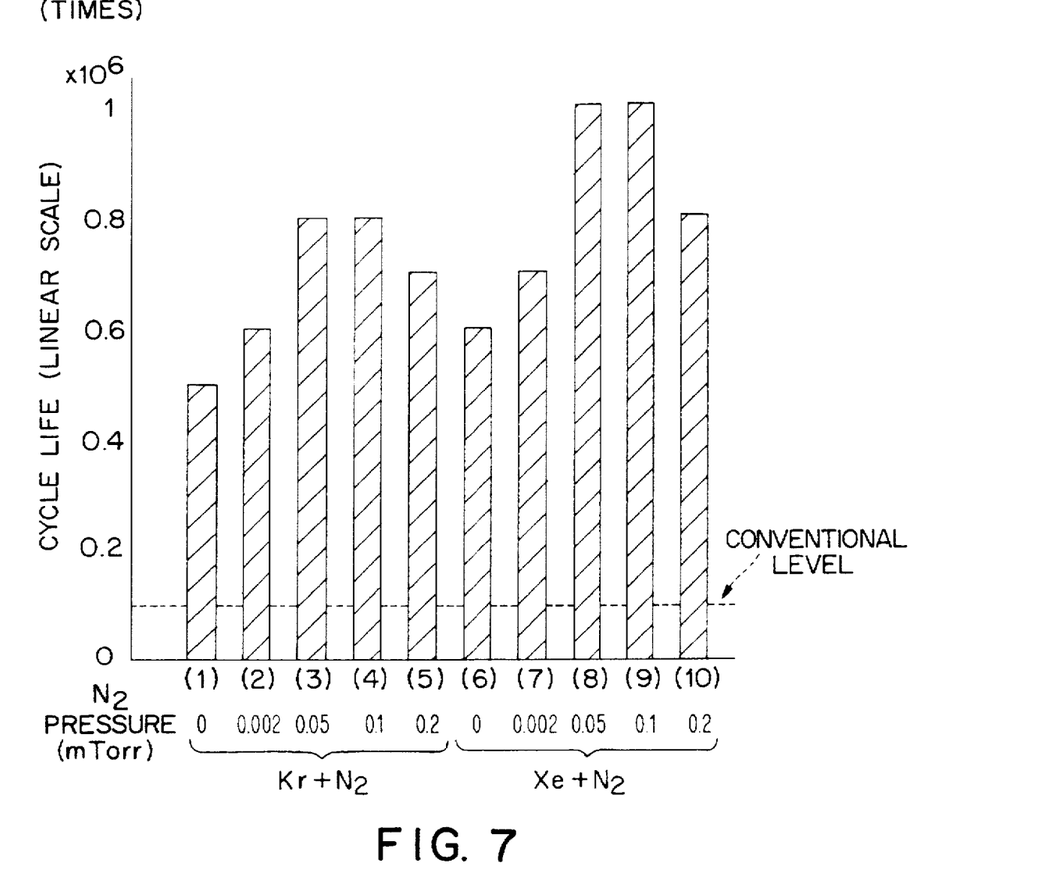
FIG. 7 shows cycle life characteristics of the phase change type optical disks in a fourth embodiment of the invention.

FIG. 7 shows the relationship between the partial pressure of $N_2$ in the discharge gas used in the forming steps 23 and 24 of the first and the second dielectric layers 2 and 4 and the cycle life characteristics of the phase change type optical disks fabricated in this embodiment. The vertical coordinate of FIG. 7 is in a linear scale. The broken line in FIG. 7 indicates the conventional level of the cycle life obtained by fabricating the phase change type optical disk with the conventional technique.

As shown in FIG. 7, by using a mixture gas of Kr and $N_2$ or that of Xe and $N_2$ with a partial pressure of $N_2$ in a range from 0.002 to 0.2 mTorr (with a total pressure of 2 mTorr) as the discharge gas in the forming steps 22 and 24 of the first and the second dielectric layers 2 and 4 by sputtering, the cycle life can improve as compared with the case where Kr or Xe gas is used singly without mixing $N_2$. Preferably, the partial pressure of $N_2$ is set to be in a range from 0.05 to 0.1 mTorr (with a total pressure of 2 mTorr) which corresponds to a partial pressure ratio of 2.5 to 5%, because the cycle life improves significantly within this range.

It is thought that further improvement of the cycle life characteristics obtained by mixing a small amount of $N_2$ gas into Xe or Kr is caused by, for example, the phenomenon that the first and the second dielectric layers 2 and 4 become mechanically and chemically more stable by $N_2$ introduction. Since the strength of the dielectric layer has a great influence on the cycle life, improved strength of the dielectric layer brings the improved cycle life characteristics. On the other hand, too much introduction of $N_2$ occurs when the partial pressure of $N_2$ in the discharge gas is too large. As a result, the dielectric layers tend to lose bonding strength and interface absorbing capability, which leads to a decrease of the cycle life.

In this embodiment, even when the pressure of the discharge gas in the sputtering process changes, the cycle life characteristics improve, as compared with that obtained in the case where Kr or Xe is singly used, as far as the partial pressure of $N_2$ is in the above-mentioned range. In addition, it is confirmed that the cycle life characteristics similarly improve when $N_2$ is mixed with a mixture gas of Xe and Kr, or that of Kr, Xe and Ar.

EXAMPLE 5

A fifth embodiment of the invention will be described below.

In the previous mentioned embodiments, either in the forming step 23 of the recording layer 3 or in the forming steps 22 and 24 of the first and the second dielectric layers 2 and 4, conventional Ar gas was replaced with the gas in which the main component was Kr or Xe. On the other hand, in this embodiment, the phase change type optical disks were fabricated by using Kr or Xe as the discharge gas both in the forming step 23 of the recording layer 3 and in the forming steps 22 and 24 of the first and the second dielectric layers 2 and 4. In addition, the phase change type optical disks were fabricated by using a different discharge gas in the forming step 23 of the recording layer 3 and in the forming steps 22 and 24 of the first and the second dielectric layers 2 and 4 from each other. The cycle life characteristics were compared among those optical disks as fabricated above.

To explain in more detail, two groups of the phase change type optical disks were fabricated in this embodiment. The first group was fabricated by using as the discharge gas Ar for forming the recording layer 3 and Kr or Xe for forming the first and the second dielectric layers 2 and 4. The second group was fabricated by using Kr or Xe both for forming the recording layer 3 and for forming the first and the second dielectric layers 2 and 4. The total pressure of the discharge gas during the forming steps was kept to be 2 mTorr.

Other fabricating conditions, the structure of the phase change type optical disks, and the composition of materials of each layer are identical with those in the previously described embodiments. The phase change type optical disks thus fabricated were evaluated in the same manner as in the first embodiment, and the cycle life of each disk was measured.

Figure 8:
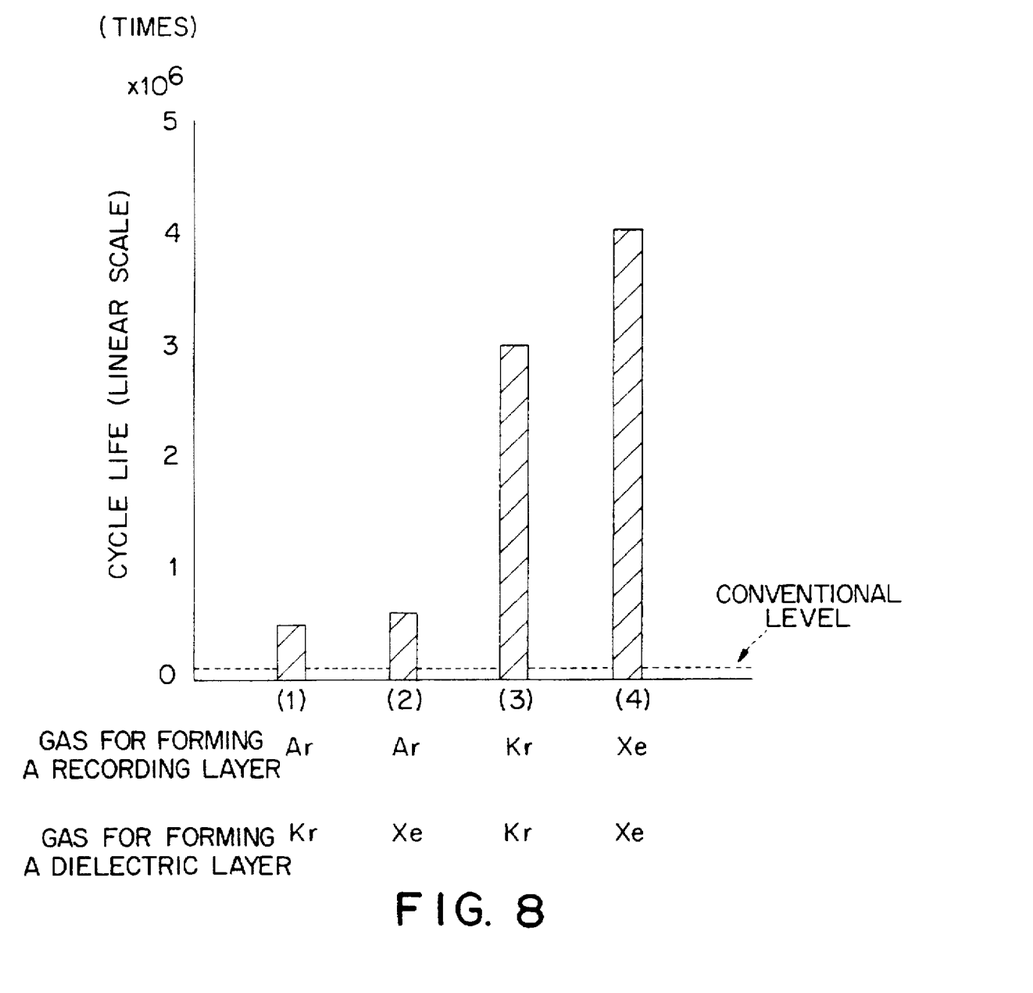
FIG. 8 shows cycle life characteristics of the phase change type optical disk in a fifth embodiment of the invention.

FIG. 8 shows the relationship between the kind of discharge gas and the cycle life characteristics of the phase change type optical disks fabricated in this embodiment. The vertical coordinate of FIG. 8 is in a linear scale. The broken line in FIG. 8 indicates the conventional level of the cycle life obtained by fabricating the phase change type optical disk with the conventional technique.

As shown in FIG. 8, replacing Ar gas with Kr or Xe both in the forming step 23 of the recording layer 3 and in the forming steps 22 and 24 of the first and the second dielectric layers 2 and 4 makes the cycle life increase 10 times or more, as compared with the conventional level. Also, it can be seen in FIG. 8 that the cycle life can improve five to six times as compared with the conventional level even when only the discharge gas in the forming steps 22 and 24 of the first and the second dielectric layers 2 and 4 was changed from Ar to Kr or Xe. The later result means that using different discharge gases for forming the recording layer 3 and for forming the first and the second dielectric layers 2 and 4 is still effective to attain improvement of the cycle life characteristics.

When the same gas is used as the discharge gas in each forming step, no work for exchanging the discharge gas is required between the steps. As a result, the whole fabricating process can be conducted successively and the running cost of the fabricating apparatus can be reduced. On the other hand, when different discharge gases are used in each step, the amount of Kr or Xe to be used can be reduced, although additional work for exchanging gases must be done between the steps. Since Kr and Xe are more expensive than Ar, the required material cost can be saved in this case.

EXAMPLE 6

A sixth embodiment of the invention is described hereinafter. In this embodiment, the phase change type optical disks in which the recording layer 3 is made of a ternary alloy of GeSbTe were used. Different discharge gases were used in a forming step of the recording layer 3, and the consequent change in the cycle life characteristics of the optical disks were studied.

First, a method for fabricating the phase change type optical disk is described. The flowchart for the fabrication steps of the phase change type optical disks of this embodiment is similar with that of the first embodiment which is shown in FIG. 2.

As the substrate 1, a polycarbonate substrate of a diameter of 130 mm having tracks for recording signals is used. First, as a forming step 22 of the first dielectric layer 2, a ZnS-SiO$_2$ mixture layer of a thickness of 1,300 angstroms was formed on the substrate 1 by an RF sputtering method with a sputtering power of 200 W. Then, as a forming step 23 of the recording layer 3, a Ge$_{22}$Sb$_{22}$Te$_{56}$ layer of a thickness of 250 angstroms was formed by a DC sputtering method with a sputtering power of 50 W. In succession, as a forming step 24 of the second dielectric layer 4, a ZnS-SiO$_2$ mixture layer of a thickness of 200 angstroms was formed by the RF sputtering method with a sputtering power of 200 W, similar to the forming step 22 of the first dielectric layer 2. Further, as a forming step 25 of the reflecting layer 5, an Al layer of a thickness of 1,500 angstroms was formed by the DC sputtering method with a sputtering power of 400 W. Finally, as a forming step 26 of the protecting layer 6, the protecting layer 6 made of polycarbonate was formed on the reflecting layer 5 in a manner previously mentioned. In the forming steps 22 through 25 of each layer by sputtering, the temperature of the substrate was not set to be a specific value.

In the above fabricating steps, Ar gas was used as the discharge gas in the forming steps 22 and 24 of the first and the second dielectric layers 2 and 4 by sputtering and in the forming step 25 of the reflecting layer 5 by sputtering. In contrast, in the forming step 23 of the recording layer 3 by sputtering, kind and pressure of the discharge gas were changed in five ways as follows (the numeral in each parentheses indicates the gas pressure of each condition): (1) Ar (2 mTorr); (2) a mixture gas of Ar (1.5 mTorr) and Kr (0.5 mTorr); (3) a mixture gas of Ar (1.0 mTorr) and Kr (1.0 mTorr); (4) a mixture gas of Ar (0.5 mTorr) and Kr (1.5 mTorr); and (5) Kr (2 mTorr). It should be noted that the total pressure of the discharge gas was 2 mTorr in any case, although the partial pressures for Ar and Kr vary.

With respect to conditions (1) through (5) mentioned above, the forming conditions in the forming steps 22 and 24-26 of the first and the second dielectric layers 2 and 4, the reflecting layer 5 and the protecting layer 6, as well as the materials of the respective layers, were identical with each other.

The thus fabricated phase change type optical disks were evaluated in the following manner. Using an optical head of a recording apparatus for recording/erasing operations, which has an objective lens with an NA number of 0.55, a line velocity of 10 m/sec, a recording power of 20 mW and a bias power (erasing power) of 10 mW; signals of 5 MHz and 3 MHz were alternately recorded by the 1-beam overwriting method. A laser beam of a wavelength of 780 nm was used in the above operations. The repetition number at which the C/N ratio (Carrier-to-Noise ratio) of the reproduced signal of 5 MHz decreased from the initial value by 3 dB was determined as the cycle life. The 1-beam overwriting method has been explained in connection with the first embodiment, and therefore, the description is omitted herein.

In addition, the quantity of the discharge gas existing in the recording layer 3 made of GeSbTe alloy was measured in the following manner. Samples in which a GeSbTe layer was formed on a Si substrate by the DC sputtering with a sputtering power of 50 W were provided. The amount of discharge gas in the GeSbTe layer (which corresponds to the recording layer 3 in this embodiment) was measured by the Rutherford Back Scattering (RBS) method. The temperature of the substrate was not set to be a specific value in this case.

The experimental results show that the quantity of the discharge gas in the GeSbTe recording layer in each of the above sputtering conditions (1) through (5) were as follows: (1) Ar of about 0.60 at %; (2) Ar of about 0.40 at %; (3) Ar of about 0.30 at %; and (4) Ar of about 0.20 at %, while in condition (5), no discharge gas was contained in the GeSbTe recording layer. In addition, the quantity of Kr in the GeSbTe layer formed under the respective sputtering conditions was measured, and the measured results showed that the quantity of Kr in the GeSbTe layer was 0.10 at % or less (below the detection limit) in each case.

Figure 9:
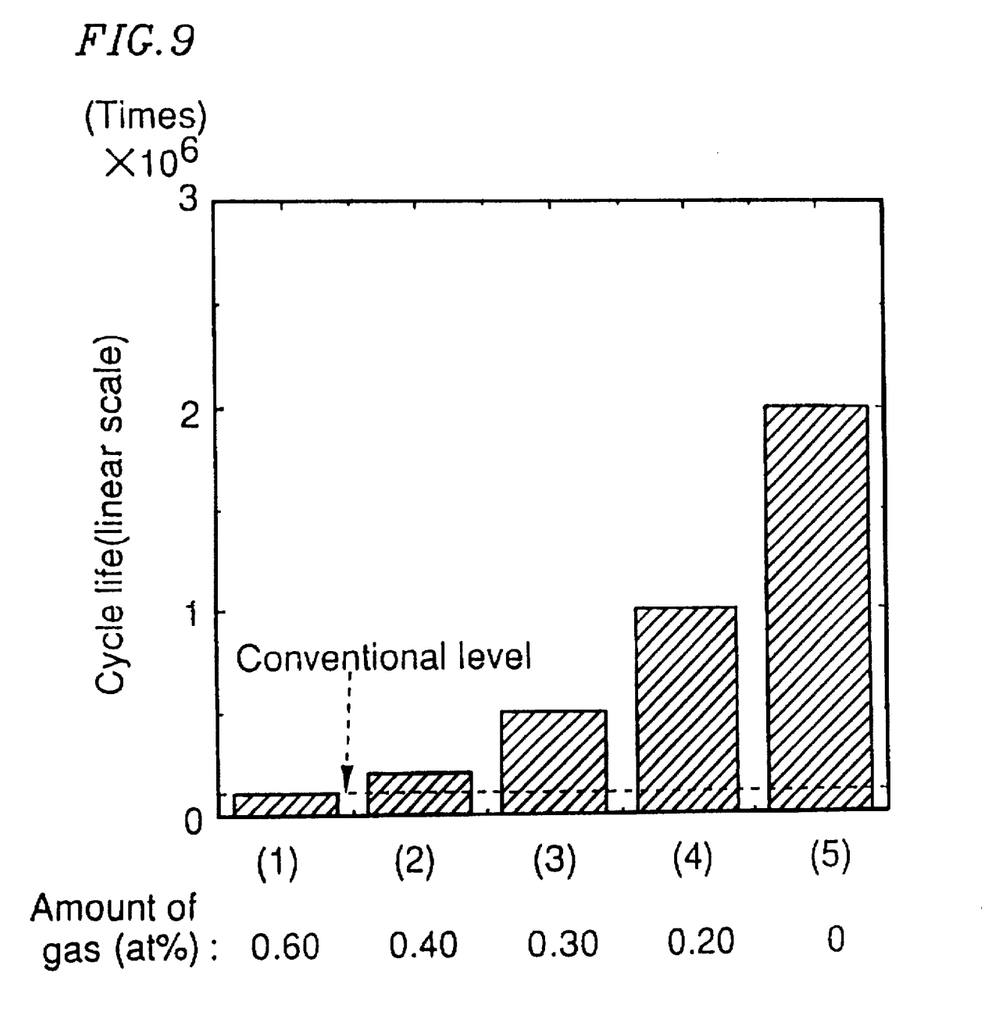
FIG. 9 shows cycle life characteristics of the phase change type optical disk in a sixth embodiment of the invention.

FIG. 9 shows the cycle life characteristics of the phase change type optical disks fabricated in the respective conditions (1) through (5). The vertical coordinate of FIG. 9 is in a linear scale. Along the horizontal axis of FIG. 9, on the other hand, the measured values of the discharge gas contained in the GeSbTe recording layer fabricated in each of the conditions (1) through (5) are indicated.

As shown in FIG. 9, the conventional phase change optical disks (condition (1)), which is fabricated by using Ar gas as the discharge gas in the forming step 23 of the recording layer 3 by sputtering and which contains Ar used as the discharge gas of about 0.60 at % in the recording layer, have a cycle life of 1×10$^5$ cycles. On the other hand, replacing Ar with Kr leads to the increase in the cycle life as well as the decrease in the quantity of the discharge gas contained in the GeSbTe recording layer. Specifically, under condition (3) in which the quantity of the discharge gas contained in the GeSbTe recording layer was about 0.30 at %, the cycle life of 5×10$^5$ cycles was achieved. Under condition (5) in which no discharge gas was contained in the GeSbTe recording layer, the cycle life was further improved up to 2×10$^6$ cycles.

Thus, by making the quantity of the discharge gas contained in the GeSbTe recording layer about 0.30 at % or less, the cycle life characteristics significantly improve so as to obtain 5×10$^5$ cycles or more. This improvement of the cycle life characteristics by reducing the quantity of the discharge gas in the recording layer is believed to be caused for the following reason. When only a small quantity of the discharge gas is introduced into the recording layer 3 during the forming step 23 thereof by sputtering, a small number of voids are generated and grown in the recording layer 3 by the repeated overwrite operations. Thus, less amount of the discharge gas in the recording layer 3 results in less void generation therein, and consequently, deterioration in the cycle life characteristics is prevented.

In the above explanation of the sixth embodiment of the invention, Kr gas, or a mixture gas of Ar and Kr, is used as the discharge gas of the sputtering process in the forming step 23 of the recording layer 3. Alternatively, Xe gas or a mixture gas of Ar and Xe can be similarly used as the discharge gas. Moreover, N$_2$ gas may be further added into the discharge gas.

As the materials for the respective layers, other materials as previously listed can be used instead of the materials used in the above explanation of the present embodiment.

Specifically, as the materials for the recording layer 3, and the first and second dielectric layers 2 and 4, other materials as previously listed can be used instead of a GeSbTe alloy and a mixture of ZnS and $SiO_2$ used in the above explanation, although improvement of the cycle life characteristics according to the invention is most significantly achieved when the GeSbTe recording layer and the ZnS-$SiO_2$ dielectric layer are used.

EXAMPLE 7

A seventh embodiment of the invention is described hereinafter. In this embodiment, the phase change type optical disks in which the recording layer 3 is made of a ternary alloy of GeSbTe were used. Different discharge gases were used in forming steps 22 and 24 of the first and second dielectric layers 2 and 4, and the consequent change in the cycle life characteristics of the optical disks were studied.

In this example, Ar gas was used as the discharge gas in the forming step 23 of the recording layer 3 by sputtering and in the forming step 25 of the reflecting layer 5 by sputtering. In contrast, in the forming steps 22 and 24 of the first and second dielectric layers 2 and 4 by sputtering, kind and pressure of the discharge gas were changed in four ways as follows (the numeral in each parentheses indicates the gas pressure of each condition): (1) Ar (2 mTorr); (2) a mixture gas of Ar (1.0 mTorr) and Kr (1.0 mTorr); (3) a mixture gas of Ar (0.5 mTorr) and Kr (1.5 mTorr); and (4) Kr (2 mTorr). It should be noted that the total pressure of the discharge gas was 2 mTorr in any case, although the partial pressures for Ar and Kr vary.

With respect to each of conditions (1) through (4) mentioned above, the forming conditions in the forming steps 23, 25 and 26 of the recording layer 3, the reflecting layer 5 and the protecting layer 6, as well as the materials of the respective layers, were identical with each other.

The cycle life characteristics of the thus fabricated phase change type optical disks were evaluated in the same manner as in the sixth example.

In addition, the quantity of the discharge gas existing in the first and second dielectric layers 2 and 4 was measured in the following manner. Samples in which a ZnS-$SiO_2$ layer was formed on a Si substrate by the RF sputtering with a sputtering power of 200 W were provided. The amount of discharge gas in the ZnS-$SiO_2$ layer (which corresponds to the first and second dielectric layers 2 and 4 in this embodiment) was measured by the Rutherford Back Scattering (RBS) method. The temperature of the substrate was not set to be a specific value in this case.

The experimental results show that the quantity of the discharge gas in the ZnS-$SiO_2$ dielectric layer in each of the above sputtering conditions (1) through (4) were as follows: (1) Ar of about 0.58 at %; (2) Ar of about 0.40 at % and Kr of about 0.12 at %; (3) Ar of about 0.20 at % and Kr of about 0.15 at %; and (4) Kr of about 0.20 at % (no Ar in this case).

Figure 10:
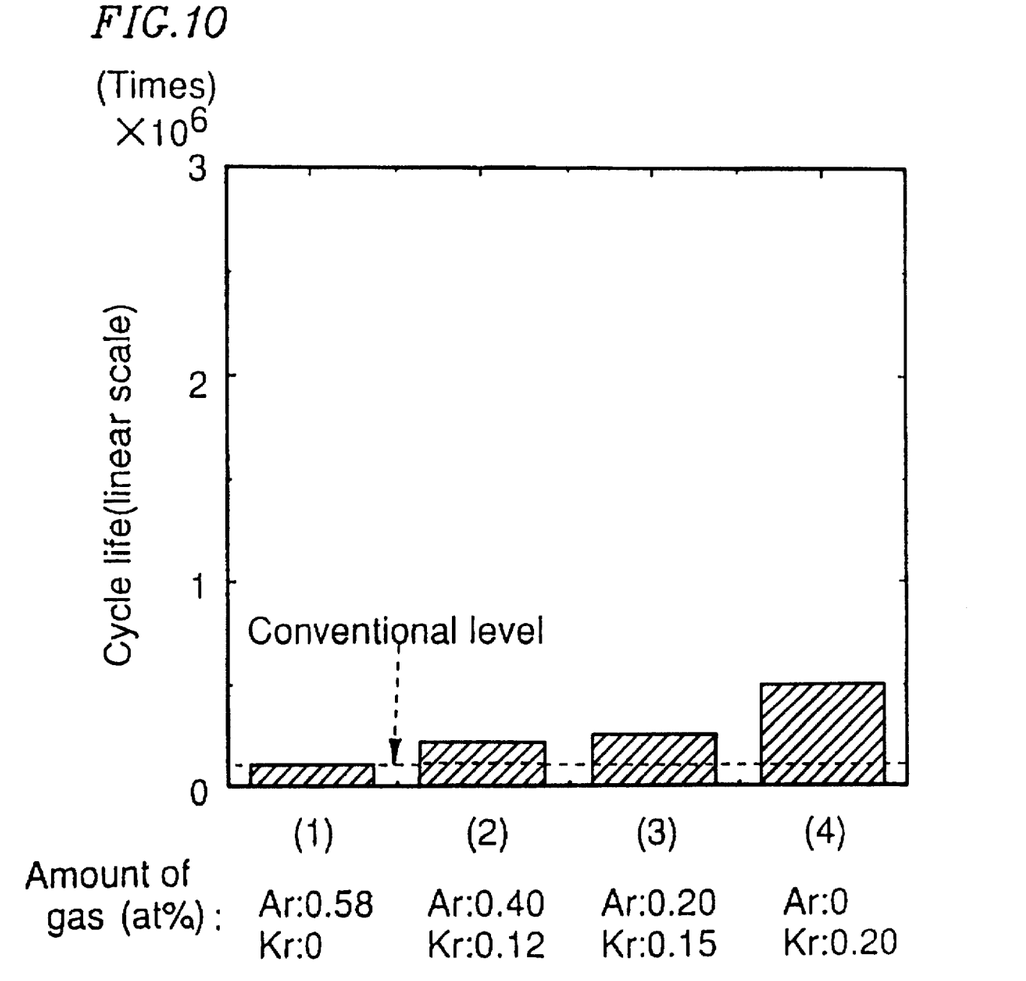
FIG. 10 shows cycle life characteristics of the phase change type optical disk in a seventh embodiment of the invention.

FIG. 10 shows the cycle life characteristics of the phase change type optical disks fabricated in the respective conditions (1) through (4). The vertical coordinate of FIG. 10 is in a linear scale. Along the horizontal axis of FIG. 10, on the other hand, the measured values of the discharge gas contained in the ZnS-$SiO_2$ dielectric layer fabricated in each of the conditions (1) through (4) are indicated.

As shown in FIG. 10, the conventional phase change optical disks (condition (1)), which is fabricated by using Ar gas as the discharge gas in the forming steps 22 and 24 of the first and second dielectric layers 2 and 4 by sputtering and which contains Ar used as the discharge gas of about 0.58 at % in the dielectric layer, have a cycle life of $1 \times 10^5$ cycles. On the other hand, replacing Ar with Kr leads to the increase in the cycle life as well as the decrease in the quantity of the discharge gas contained in the ZnS-$SiO_2$ dielectric layer. Specifically, under condition (4) in which the quantity of the discharge gas contained in the ZnS-$SiO_2$ dielectric layer was about 0.20 at % of Kr, the cycle life of $5 \times 10^5$ cycles was achieved.

Thus, by making the quantity of the discharge gas contained in the ZnS-$SiO_2$ dielectric layers about 0.20 at % or less, the cycle life characteristics significantly improve so as to obtain $5 \times 10^5$ cycles or more. This improvement of the cycle life characteristics by reducing the quantity of the discharge gas in the dielectric layers is believed to be caused for the following reason. When only a small quantity of the discharge gas is introduced into the first and second dielectric layers 2 and 4 during the forming steps 22 and 24 thereof by sputtering, a small amount of the discharge gas is introduced from the dielectric layers 2 and 4 into the recording layer 3 during the repeated overwrite operations. As a result, a small number of voids are generated and grown in the recording layer 3 by the repeated overwrite operations. Thus, less amount of the discharge gas in the first and second dielectric layers 2 and 4 results in less void generation in the recording layer 3, and consequently, deterioration in the cycle life characteristics is prevented.

In the above explanation of the seventh embodiment of the invention, Kr gas, or a mixture gas of Ar and Kr, is used as the discharge gas of the sputtering process in the forming steps 22 and 24 of the first and second dielectric layers 2 and 4. Alternatively, Xe gas or a mixture gas of Ar and Xe can be similarly used as the discharge gas. Moreover, $N_2$ gas may be further added into the discharge gas.

As the materials for the respective layers, other materials as previously listed can be used instead of the materials used in the above explanation of the present embodiment.

Specifically, as the materials for the recording layer 3, and the first and second dielectric layers 2 and 4, other materials as previously listed can be used instead of a GeSbTe alloy and a mixture of ZnS and $SiO_2$ used in the above explanation, although improvement of the cycle life characteristics according to the invention is most significantly achieved when the GeSbTe recording layer and the ZnS-$SiO_2$ dielectric layer are used.

As described above, according to this invention, in forming steps of a phase change type recording layer or a dielectric layer of an optical information storage medium by sputtering, a discharge gas which includes at least one of Kr gas and Xe gas is used. Alternatively, at least one of Ar gas and $N_2$ gas may be further added to the discharge gas. Forming the recording layer or the dielectric layer in these discharge gases enables preventing of the introduction of the discharge gas into each layer during the forming steps. As a result, the void generation and growth in the recording layer is suppressed. Consequently, the deterioration of the cycle life characteristics due to repeated overwrite operations can be restrained. Therefore, high reliability and long life of the optical information storage medium is attained.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. An optical information storage medium comprising a multilayer structure formed on a substrate, the multilayer structure being formed by a sputtering process in a discharge gas including at least one of the group consisting of Kr and Xe and including at least a first dielectric layer, a recording layer which shows reversible phase change between an amorphous phase and a crystal phase, and a second dielectric layer, wherein the amount of the discharge gas contained in the recording layer is about 0.3 at % or less.

2. An optical information storage medium according to claim 1, wherein at least one of the first dielectric layer, the recording layer and the second dielectric layer contains no Ar used as the discharge gas.

3. An optical information storage medium according to claim 1, wherein a limited amount of voids of the discharge gas generated in the recording layer corresponds to an amount which provides a decrease of 3 dB in a Carrier-to-Noise ratio compared with an initial value after overwriting operations are repeated a predetermined number of times.

4. An optical information storage medium according to claim 3, wherein the predetermined number of times is at least 100,000 times.

5. An optical information storage medium according to claim 1, wherein the recording layer is made of chalcogen alloy.

6. An optical information storage medium according to claim 5, wherein the recording layer has a main component selected from the group consisting of SbTe, GeSbTe, GeSbTeSe, GeSbTePd, TeGeSnAu, AgSbTe, GeTe, GaSb, InSe, InSb, InSbTe, InSbSe and InSbTeAg.

7. An optical information storage medium according to claim 6, wherein the recording layer has a main component of GeSbTe.

8. An optical information storage medium according to claim 1, wherein the first dielectric layer and the second dielectric layer are made of at least one material selected from the group consisting of $SiO_2$, SiO, $TiO_2$, MgO, $Ta_2O_5$, $Al_2O_3$, $GeO_2$, $Si_3N_4$, BN, AlN, SiC, ZnS, ZnSe, ZnTe and PbS.

9. An optical information storage medium according to claim 8, wherein the first dielectric layer and the second dielectric layer are made of a mixture of $SiO_2$ and ZnS.

10. An optical information storage medium according to claim 1, wherein the optical information storage medium further comprises a reflecting layer on the second dielectric layer.

11. An optical information storage medium comprising a multilayer structure formed on a substrate, the multilayer structure including at least a first dielectric layer, a recording layer which shows reversible phase change between an amorphous phase and a crystal phase, and a second dielectric layer, wherein at least one of the first dielectric layer, the recording layer and the second dielectric layer is formed by a sputtering process in a discharge gas, the discharge gas including at least one of Kr gas and Xe gas.

12. An optical information storage medium according to claim 11, wherein the multilayer structure contains sufficiently small amount of the discharge gas so that a limited amount or less of voids of the discharge gas is generated in the recording layer during repeated over-write operations, and the limited amount of voids of the discharge gas generated in the recording layer corresponds to an amount which provides a decrease of 3 dB in a Carrier-to-Noise ratio compared with an initial value after overwriting operations are repeated a predetermined number of times.

13. An optical information storage medium according to claim 12, wherein the predetermined number of times is at least 100,000 times.

14. An optical information storage medium according to claim 11, wherein at least one of the first dielectric layer, the recording layer and the second dielectric layer contains no Ar used as the discharge gas.

15. An optical information storage medium according to claim 11, wherein the amount of the discharge gas contained in the recording layer is about 0.3 at % or less.

16. An optical information storage medium according to claim 11, wherein the total amount of the discharge gas contained in the first dielectric layer and the second dielectric layer is about 0.2 at % or less.

17. An optical information storage medium according to claim 11, wherein the recording layer is made of chalcogen alloy.

18. An optical information storage medium according to claim 17, wherein the recording layer has a main component selected from the group consisting of SbTe, GeSbTe, GeSbTeSe, GeSbTePd, TeGeSnAu, AgSbTe, GeTe, GaSb, InSe, InSb, InSbTe, InSbSe and InSbTeAg.

19. An optical information storage medium according to claim 18, wherein the recording layer has a main component of GeSbTe.

20. An optical information storage medium according to claim 11, wherein the first dielectric layer and the second dielectric layer are made of at least one material selected from the group consisting of $SiO_2$, SiO, $TiO_2$, MgO, $Ta_2O_5$, $Al_2O_3$, $GeO_2$, $Si_3N_4$, BN, AlN, SiC, ZnS, ZnSe, ZnTe and PbS.

21. An optical information storage medium according to claim 20, wherein the first dielectric layer and the second dielectric layer are made of a mixture of $SiO_2$ and ZnS.

22. An optical information storage medium according to claim 11, wherein the optical information storage medium further comprises a reflecting layer on the second dielectric layer.

23. An optical information storage medium comprising a multilayer structure formed on a substrate, the multilayer structure being formed by a sputtering process in a discharge gas including at least one of the group consisting of Kr and Xe and including at least a first dielectric layer, a recording layer which shows reversible phase change between an amorphous phase and a crystal phase, and a second dielectric layer, wherein a total amount of the discharge gas contained in the first dielectric layer and the second dielectric layer is about 0.2 at % or less.

24. An optical information storage medium comprising a multilayer structure formed on a substrate, the multilayer structure being formed by a sputtering process in a discharge gas including at least one of the group consisting of Kr and Xe and including at least a first dielectric layer, a recording layer which shows reversible phase change between an amorphous phase and a crystal phase, and a second dielectric layer, wherein an amount of voids of the discharge gas generated in the recording layer is less than or equal to an amount which provides a decrease of 3 dB in a Carrier-to-Noise ratio compared with an initial value after overwriting operations are repeated a predetermined number of times.

* * * * *